United States Patent [19]

Le Poole et al.

[11] 4,306,149

[45] Dec. 15, 1981

[54] ELECTRON MICROSCOPE (COMPRISING AN AUXILIARY LENS)

[75] Inventors: Jan B. Le Poole, Voorschoten; Karel D. van der Mast; Christiaan J. Rakels, both of Eindhoven, all of Netherlands

[73] Assignee: U.S. Philips Corporation, New York, N.Y.

[21] Appl. No.: 909,649

[22] Filed: May 25, 1978

[30] Foreign Application Priority Data

May 26, 1977 [NL] Netherlands ................ 7705789

[51] Int. Cl.³ .................................... G01M 23/00
[52] U.S. Cl. ........................ 250/311; 250/396 ML
[58] Field of Search ................... 250/311, 396 ML

[56] References Cited

U.S. PATENT DOCUMENTS

| | | | |
|---|---|---|---|
| 3,748,467 | 7/1973 | Suganuma | 250/311 |
| 3,795,809 | 3/1974 | Takashima | 250/311 |
| 3,872,305 | 3/1975 | Kolke | 250/311 |

*Primary Examiner*—Harold A. Dixon
*Attorney, Agent, or Firm*—Thomas A. Briody; Robert T. Mayer; Jack E. Haken

[57] ABSTRACT

A switchable auxiliary lens is arranged in the vicinity of the objective lens of an electron microscope to enable switching between TEM mode and STEM mode. The auxiliary lens may be formed by an interruption in the magnetic circuit of one of the poles of the main lens, and may include an electromagnetic coil which can be excited in a reversable manner.

11 Claims, 4 Drawing Figures

ELECTRON MICROSCOPE (COMPRISING AN AUXILIARY LENS)

The invention relates to an electron microscope, comprising an electron source, a condenser lens, an objective lens, and a switching device for selection of TEM or STEM operation.

Contemporary electron microscopes are usually constructed so that operation in the transmission mode (TEM) as well as in the scanning transmission mode (STEM) is possible. Known electron microscopes of this type have the drawback that either the switching between the two modes as such is complex and time-consuming (for example, the excitation of the condensor lens must also be changed) or that the operation in one of the two modes is subject to restrictions (for example, because an excessive part of the imaging electrons is intercepted by the lens system, so that optimum magnification cannot be utilized or in that too little free space is available) so that full detection of the information produced cannot be achieved.

The invention has for its object to eliminate these drawbacks; to this end, an electron microscope in accordance with the invention is characterized in that an auxiliary lens which is arranged between the condensor lens and the objective lens forms part of the switching device.

Because use is made of a switchable auxiliary lens for changing over between the two modes of operation, switching over can be extremely simply and quickly performed and detection is not subject to restrictions in either of the two modes.

In a preferred embodiment, the auxiliary lens is included in the objective lens of the electron microscope. As a result, a comparatively weak lens suffices and only minor modifications must be performed, for example, in the known Philips electron microscope model EM 400.

In a practical embodiment of an electron microscope in accordance with the invention, the auxiliary lens is formed by an electromagnetic coil which is accommodated in a holder of the objective lens and which can be independently excited. The auxiliary lens may further comprise a nonmagnetic interruption in a magnetic yoke of the objective lens. The desired changing of the mode is of operation is realized by switching on or off or by polarity reversal of the electromagnetic part of the auxiliary lens.

To this end, an electron microscope in accordance with the invention comprises a substantially symmetrical objective lens above which an auxiliary lens which is at least partly switched off. When the auxiliary lens is switched on, the auxiliary lens compensates for an excessive effect of a first lens field of the objective lens. As a result, an optical system is obtained which has properties which substantially correspond to those of a standard TEM optical system. When the auxiliary lens is fully or sufficiently switched off, a symmetrical STEM objective is formed. Thus, an optimum lens configuration is used in both modes. Thanks to a second lens field of the symmetrical objective lens, a wider detection angle for dark-field detection is available. Because a symmetrical arrangement is maintained, optimum space exists for tilting a specimen holder, while short focal distances can still be realized. The objective lens excitation is the same for TEM and the STEM mode so that no undesirable variations occur due to switching over.

Preferred embodiments in accordance with the invention will be described in detail hereinafter with reference to the accompanying drawings in which.

Figure 1:
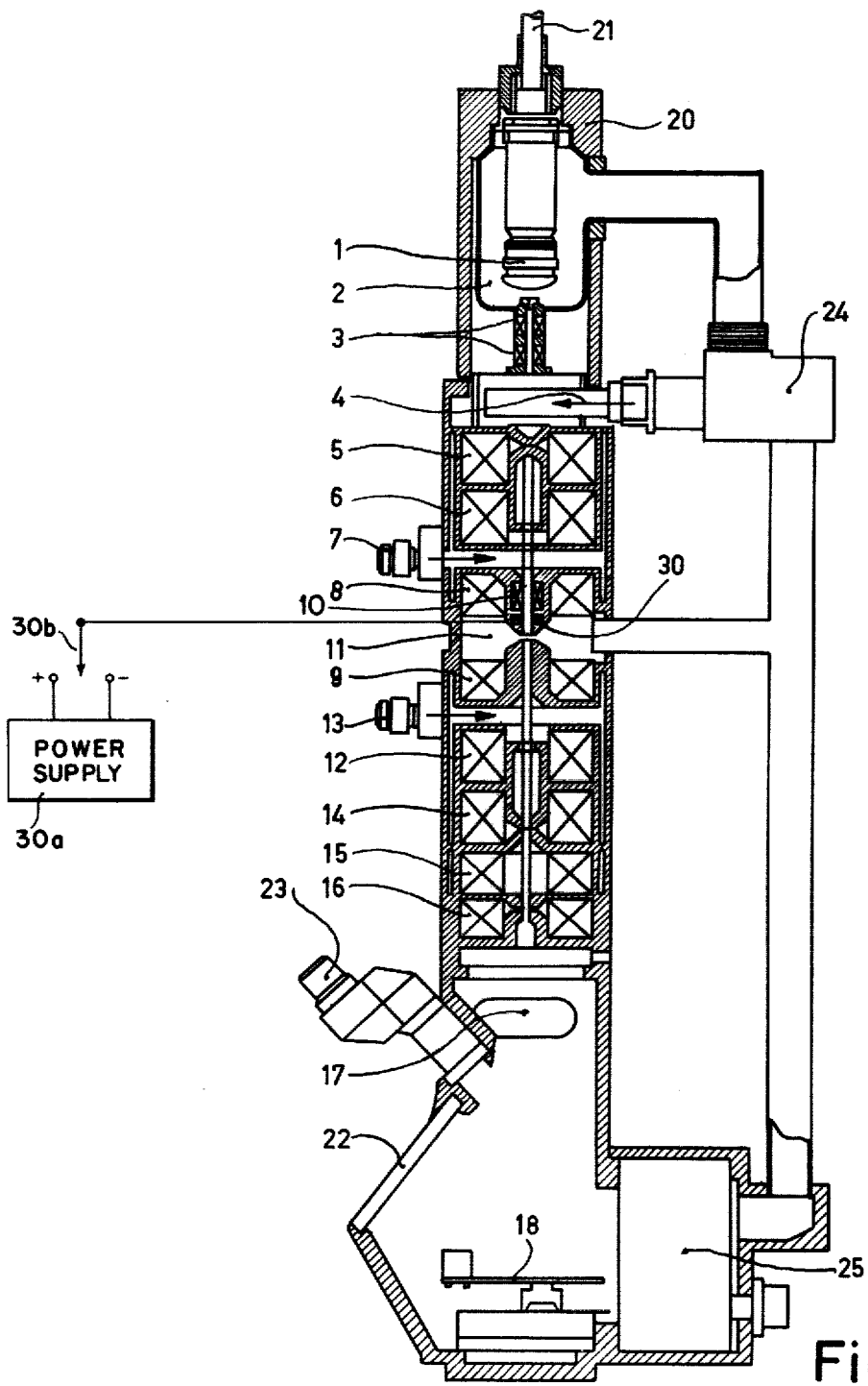
FIG. 1 is a diagrammatic sectional view of an electron microscope.

An electron microscope as shown in FIG. 1 comprises an electron source 1 with an anode 2, a beam alignment system 3 and an aperture 4, a condensor system comprising a first condensor lens 5, a second condensor lens 6, and a condensor aperture 7, an objective comprising a first objective pole 8 and a second objective pole 9, a beam scanning system 10, an object space 11, a diffraction lens 12 with a diffraction aperture 13, an intermediate lens 14, a projection system with a first projection lens 15 and a second projection lens 16, a film camera 17 and a viewing screen 18. All these parts are accommodated in a housing 20, comprising an electrical input lead 21 for the electron source and a window 22. An optical viewer 23, a vacuum pumping device 24, and a plate camera 25 are connected to the housing.

In the described electron microscope, an auxiliary lens 30 is included in the objective lens in accordance with the invention together with an associated power supply 39a and reversing switch 39b. Switch 30b functions to reverse the polarity of current flow in the auxiliary lens 30. The objective lens with auxiliary lens will be described in detail hereinafter with reference to FIG. 2.

Figure 2:
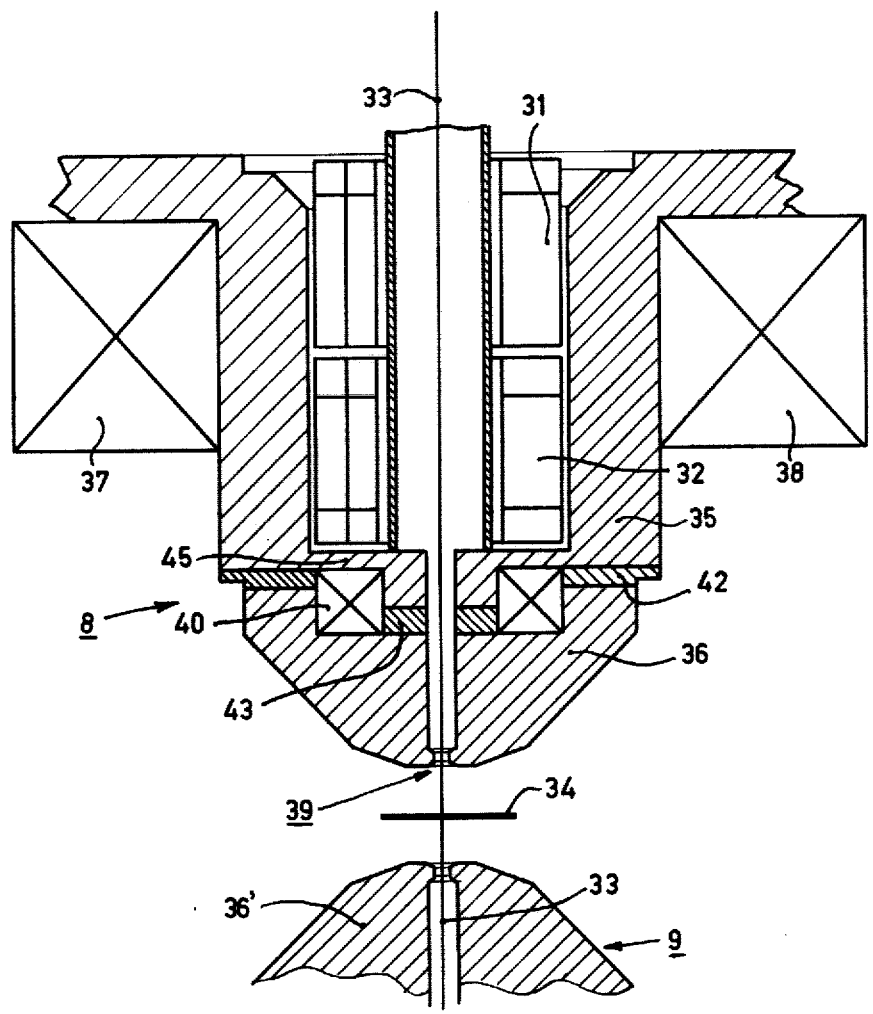
FIG. 2 is a diagrammatic sectional view of an objective lens, including an auxiliary lens, for the electron microscope of FIG. 1.

FIG. 2 is a sectional view of an objective lens, comprising two poles 8 and 9 as shown in FIG. 1. The part 8, being the pole of the objective lens which is situated nearest to the condensor, comprises beam deflection coils 31 and 32 whereby an axial electron beam can be deflected in two mutually perpendicular directions, so that a specimen 34 can be scanned, for example, in a raster-like manner.

The scanning coils 31 and 32 are accommodated in a yoke 35 of magnetic material, said yoke continuing into a poleshoe 36 as in a customary lens. The magnetic yoke envelops an excitation coil 37 and 38 of the objective lens. A magnetic field which is cogenerated by this coil thus forms a strong lens at the area of the gap 39 between the poles.

In a preferred embodiment in accordance with the invention, an auxiliary lens is mounted in the yoke, in this case by the inclusion of an auxiliary coil 40 and non-magnetic interruptions 42 and 43 in the yoke of the objective lens.

The poleshoe 36, the non-magnetic disc 43, a part 45 of the magnetic yoke of the objective pole, and the non-magnetic disc 43 form a magnetic circuit of the auxiliary lens. The disc 43 is the lens gap, while the disc 42 extracts, for example, ⅛ of the number of ampere turns required for the auxiliary lens from the main lens. In the TEM mode, the coil 40 contributes only another ⅛ part thereto, while in the STEM mode the coil 40 subtracts ⅛ part therefrom by pole reversal, so that a lens having a negligible strength of 1/9 of the strength required in the TEM mode remains. As a result, the auxiliary lens coil 40 requires only a small number of ampere turns. By means of such an auxiliary lens, switching between the two modes, and optimum operation in both modes is possible. For optical operation in the TEM mode, it is desirable to adapt the illumination system to a number of conditions; for example, it is desirable to realize independent adjustment of the target spot diameter of the electron beam in the specimen plane; this can be realized by way of adequate parallelity of the illumination across the entire specimen plane to be illuminated.

An adjustment of this kind is difficult to realize when use is made of a standard Riecke-Ruska lens, without an auxiliary lens. The adjustment can be achieved by utilizing an auxiliary lens, because the auxiliary lens compensates for the condensor field of the objective lens, so that the overall lens effect is comparable to that of a standard TEM optical system satisfying said requirements.

It has been found that a symmetrical Riecke-Ruska objective lens is particularly attractive for STEM use. In such a lens arrangement, the specimen is situated halfway between the upper pole and the lower pole of the lens, and the strength of the two lens parts is equal if the aperture in both lens parts is the same. This lens is also particularly attractive because, as a result of the lens effect of the lower half of the lens, electrons which emerge from the specimen at a comparatively wide angle, such as dark-field electrons, are deflected towards the optical axis, with the result that they are not intercepted by successive apertures. A further advantage consists is use can be made of the same objective lens current, applicable to a strongly excited lens, for TEM as well as STEM operation so that a short focal distance and a small number of lens faults are ensured. The objective current need not be changed for switching over from STEM to TEM and vice versa.

Such a symmetrical configuration should preferably be maintained for STEM operation.

The invention provides a lens configuration which satisfies said requirements by the arrangement of an auxiliary lens at a comparatively small distance from the objective lens. The auxiliary lens in the preferred embodiment described with reference to FIG. 2 is accommodated in the upper pole of the objective lens, the auxiliary lens being active in the TEM mode. However, the auxiliary lens can alternatively be accommodated in the lower pole of the objective lens. An objective lens arranged at the latter area is active in the STEM mode, when the lens configuration is further adapted, to prevent the loss of, for example, dark field electrons emerging at comparatively wide angles.

Figure 3A:
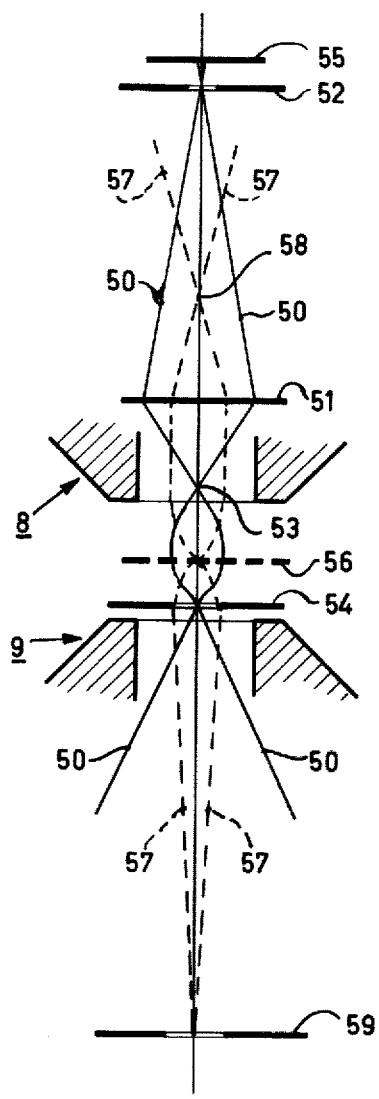
FIGS. 3a and 3b show beam paths in two types of electron microscopes.
Figure 3B:
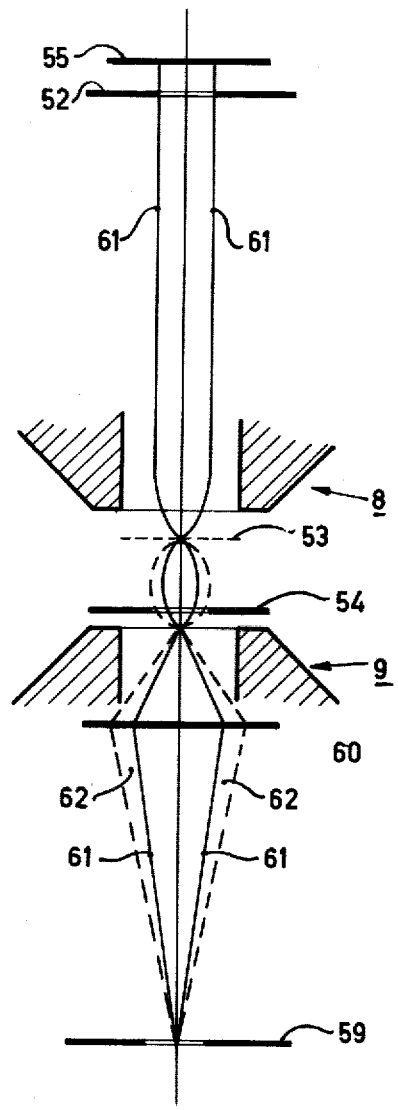

FIG. 3 shows, by way of illustration, beam paths in an electron microscope for an embodiment comprising an auxiliary lens in a first objective pole (FIG. 3a) as well as in a second objective pole (FIG. 3b).

A beam path denoted by solid lines in FIG. 3a represents a setting in which a condensor aperture 52 is imaged by adapted excitation of an auxiliary lens 51 in accordance with the invention via an intermediate image 53 in an objective aperture 54. The setting of a condensor lens 55 has no effect on this image. The indicated beam path also exhibits the degree of parallelity of the illuminating electron beam at the area of a specimen 56. The aperture angle of the illuminating beams is determined by the size and the position of the condensor aperture. The latter can also be seen in a second beam path which is denoted by broken lines 57. The auxiliary lens, i.e. in the STEM mode, the specimen is apparently imaged in the condensor aperture plane. The beam 57 forms an image in a S.A. aperture 59. In the Figure, this beam path corresponds to the STEM mode behind the auxiliary lens, so that this beam would be parallel as from the condensor aperture because the auxiliary lens is not active at this area.

FIG. 3b shows an auxiliary lens 60 accommodated in a second objective pole 9. The auxiliary lens, now connected for STEM operation, prevents a part 62 of the electrons of the electron beam 61, emerging from the specimen at a compatively wide angle, from being intercepted by parts of the electron microscope. A substantial gain is thus realized, notably for dark field illumination.

The foregoing illustrates that for some applications both poles of the objective lens can be provided with an auxiliary lens. The electromagnetic part of the auxiliary lens can be assembled, for example, as described in U.S. Pat. No. 3,394,254.

In a preferred embodiment, the main power supplies for the objective lens are connected in series with an auxiliary lens power supply for the electromagnetic auxiliary lens.

In a further preferred embodiment, the auxiliary lens is completely constructed as a magnetic lens derived from the field of the main lens, the strength of the auxiliary lens being controllable by mechanical adjustment, for example, by means of an adjustable short-circuit at an interruption in the magnetic yoke of the main lens. Even though an objective lens has constantly been referred to as the main lens in the foregoing, the invention is by no means restricted thereto; the auxiliary lens can alternatively be accommodated, depending on the purpose, in any of the lenses of an imaging forming or electron beam exploring or working apparatus.

What is claimed is:

1. An electromagnetic lens for an electron-optical device comprising:
   a first poleshoe;
   a second poleshoe separated from said first poleshoe to define a gap;
   excitation means which function to produce a focussing magnetic field across said gap;
   a magnetic interruption in said first poleshoe; and
   auxiliary excitation means which function to produce a magnetic field across said interruption.

2. In an electron microscope which comprises an electron source; a condenser lens, an objective lens which includes a yoke, two poleshoes spaced apart from each other to define a gap, and at least one coil; and switching means which function to select either TEM or STEM operation of the microscope; the improvement wherein the switching means includes an auxiliary lens disposed near the objective lens, which auxiliary lens comprises an auxiliary lens coil which is disposed in the yoke of the objective lens.

3. In an electron microscope which comprises an electron source; a condenser lens; an objective lens which includes a yoke, two poleshoes spaced apart from each other to define a gap, at least one coil; and switching means which function to select either TEM or STEM operation of the microscope; the improvement wherein the switching means include an auxiliary lens disposed near the objective lens which auxiliary lens comprises an interruption in a magnetic circuit in a poleshoe of the objective lens.

4. In an electron microscope which comprises an electron source; a condenser lens; an objective lens which includes a yoke, two poleshoes spaced apart from each other to define a gap, and at least one coil; and switching means which function to select TEM or STEM operation of the microscope; the improvement wherein the switching means include an auxiliary lens disposed near the objective lens wherein a poleshoe of the objective lens includes a magnetic interruption and further comprising means for adjusting the auxiliary lens which function to displace a magnetic short-circuit across the interruption.

5. In an electron microscope which comprises an electron source; a condenser lens; an objective lens which includes a yoke, two poleshoes spaced apart from each other to define a gap, and at least one coil; and switching means which function to select either TEM or STEM operation of the microscope; the improvement wherein the switching means include an auxiliary lens disposed near the objective lens, wherein an object plane is disposed substantially halfway between the poleshoes, a first poleshoe of the objective being situated closer to the electron source than a second poleshoe of the objective lens and further comprising an objective aperture disposed between the object plane and the second poleshoe.

6. The improvement of claim 5, further including a condenser aperture which can be imaged approximately in the plane of the objective aperture by means of the auxiliary lens, independent of the excitation of the condenser lens.

7. In an electron microscope which comprises an electron source; a condenser lens; an objective lens which includes a yoke, two poleshoes spaced apart from each other to define a gap, at least one coil; and switching means which function to select either a TEM or STEM operation of the microscope; the improvement wherein the switching means include an auxiliary lens disposed near the objective lens which auxiliary lens comprises the combination of an electromagnetic coil, means for reversibly exciting the electromagnetic coil, and a permanent magnet.

8. The improvement of claim 7, wherein the electromagnetic coil produces from approximately one half to approximately one third of the total magnetic field of the auxiliary lens.

9. The improvement of claim 7, wherein the electromagnetic coil is connected in series with one or more coils of the objective lens.

10. The improvement of any one of claims 8 or 9 or 2-4, wherein the auxiliary lens is disposed in front of a main plane of the objective lens and is active in the TEM mode.

11. The improvement of any one of claims 3-8, wherein the auxiliary lens is disposed behind the main plane of the objective lens and is active in the STEM mode.

* * * * *